(12) United States Patent
Sui et al.

(10) Patent No.: US 9,190,327 B2
(45) Date of Patent: Nov. 17, 2015

(54) CMOS TRANSISTORS AND FABRICATION METHOD THEREOF

(71) Applicants: SEMICONDUCTOR MANUFACTURING INTERNATIONAL (BEIJING) CORPORATION, Beijing (CN); Semiconductor Manufacturing International (Shanghai) Corporation, Shanghai (CN)

(72) Inventors: Yunqi Sui, Shanghai (CN); Gezhi Liu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/228,832

(22) Filed: Mar. 28, 2014

(65) Prior Publication Data
US 2015/0061029 A1 Mar. 5, 2015

(30) Foreign Application Priority Data
Sep. 4, 2013 (CN) .......................... 2013 1 0398091

(51) Int. Cl.
*H01L 21/8238* (2006.01)
*H01L 27/092* (2006.01)

(52) U.S. Cl.
CPC *H01L 21/823814* (2013.01); *H01L 21/823807* (2013.01); *H01L 27/092* (2013.01)

(58) Field of Classification Search
CPC ................... H01L 21/28141; H01L 21/28132; H01L 21/823468; H01L 21/823864; H01L 29/6653; H01L 29/6656
USPC .......... 257/288, 368, 369; 438/151, 267, 184, 438/197, 199, 230
See application file for complete search history.

(56) References Cited

U.S. PATENT DOCUMENTS

| | | | |
|---|---|---|---|
| 8,828,832 B2 * | 9/2014 | Tsai et al. ...................... | 438/300 |
| 2008/0265256 A1* | 10/2008 | Lin et al. .......................... | 257/70 |
| 2010/0155827 A1* | 6/2010 | Kim et al. ..................... | 257/327 |
| 2013/0316504 A1* | 11/2013 | Cheng et al. .................. | 438/238 |

* cited by examiner

*Primary Examiner* — Jarrett Stark
*Assistant Examiner* — Shahed Ahmed
(74) *Attorney, Agent, or Firm* — Anova Law Group, PLLC (57) ABSTRACT

A method is provided for forming CMOS transistors. The method includes providing a semiconductor substrate having at least one first region and at least one second region; and forming a first gate in the first region and a second gate in the second region. The method also includes forming first offset spacers made of nitrogen-contained material on side surfaces of the first gate and the second gate; and forming dummy spacers on the first offset spacers in the first region and a dummy spacer material layer covering the second gate and the semiconductor substrate in the second region. Further, the method includes forming SiGe stress layers in the semiconductor substrate at both sides of the first gate; and removing the first offset spacers, the dummy spacers and the dummy spacer material layer. Further, the method also includes forming second offset spacers on the first gate and the second gate.

19 Claims, 9 Drawing Sheets

CMOS TRANSISTORS AND FABRICATION METHOD THEREOF

CROSS-REFERENCES TO RELATED APPLICATIONS

This application claims the priority of Chinese patent application No. 201310398091.4, filed on Sep. 4, 2013, the entirety of which is incorporated herein by reference.

FIELD OF THE INVENTION

The present invention generally relates to the field of semiconductor manufacturing technology and, more particularly, relates to CMOS transistors and fabrication techniques thereof.

BACKGROUND

In the manufacturing of semiconductor devices, stress may change the band gap and the carrier mobility of the silicon material, thus improving the performance of the MOS transistors by the stress has become a more and more common method. Carriers in the NMOS transistors are electrons; and carriers in the PMOS transistors are holes. Specifically, by properly controlling the stress in the cannel region, the carrier mobility of the CMOS transistors can be increased, thus the drive current of the CMOS transistors can be increased; and the performance of the CMOS transistor may be significantly improved.

The embedded SiGe technology can be used to generate a compressive stress to the channel region of a PMOS transistor, so as to increase the carrier mobility of the holes. That is, SiGe structures are formed in the regions for subsequently forming source/drain regions firstly; then the SiGe structures are doped to form the source/drain regions. The SiGe structures and the substrate of the PMOS transistors may have a lattice mismatch, thus a compressive stress may be generated in the channel region of the PMOS transistor; and the performance of the PMOS transistor may be improved.

FIGS. 1~11 illustrate semiconductor structures corresponding to certain stages of an existing fabrication process of CMOS transistors.

Figure 1:
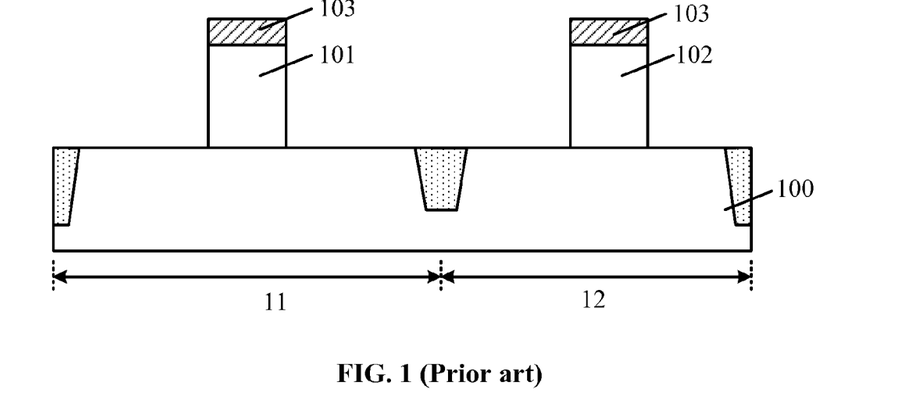
FIGS. 1~11 illustrate semiconductor structures corresponding to certain stages of an existing fabrication process of CMOS transistors.

As shown in FIG. 1, at the beginning of the fabrication process, a semiconductor substrate 100 is provided. The semiconductor substrate 100 includes at least one first region 11 and at least one second region 12. The first region 11 is used to form a PMOS transistor; and the second region 12 is used to form an NMOS transistor. A poly silicon layer (not shown) is formed on the semiconductor substrate 100. A patterned mask layer 103 made of the silicon nitride is formed on the poly silicon layer; a first gate 101 is formed on the semiconductor substrate 100 in the first region 11; and a second gate 102 is formed on the semiconductor substrate 100 in the second region 12 by etching the semiconductor substrate 100 using the pattered mask 103 as an etching mask. Then, a thermal oxide layer (not shown) is formed on surfaces of the first gate 101, the second gate 102 and the semiconductor substrate 100 by a thermal oxidation process.

Figure 2:
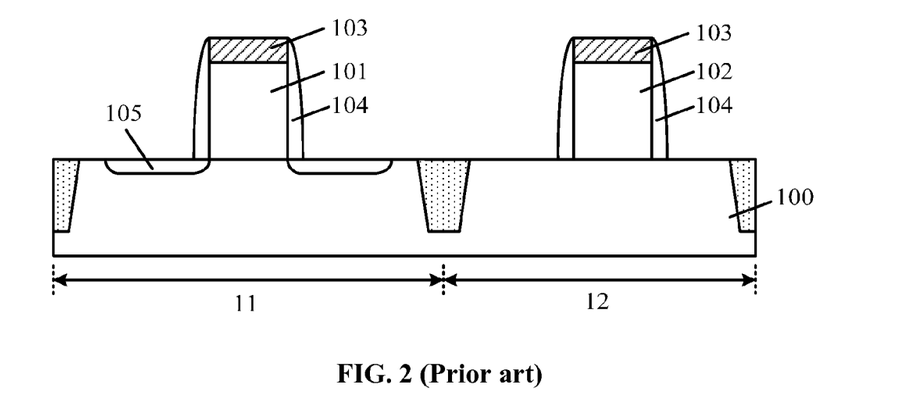

As shown in FIG. 2, after forming the first gate 101 and the second gate 102, sidewall spacers 104 made of silicon nitride are formed on the side surfaces of the first gate 101 and the second gate 102. Further, first lightly doped regions 105 are formed in the surface of the semiconductor substrate 100 in the first region 11 at both sides of the first gate 101 by a P-type ion implantation process using the mask layer 103, the first gate 101 and the first sidewall spacers 104 as a mask. The doping concentration of the lightly doped region is smaller than the doping concentration of the subsequently formed heavily doped region.

Figure 3:
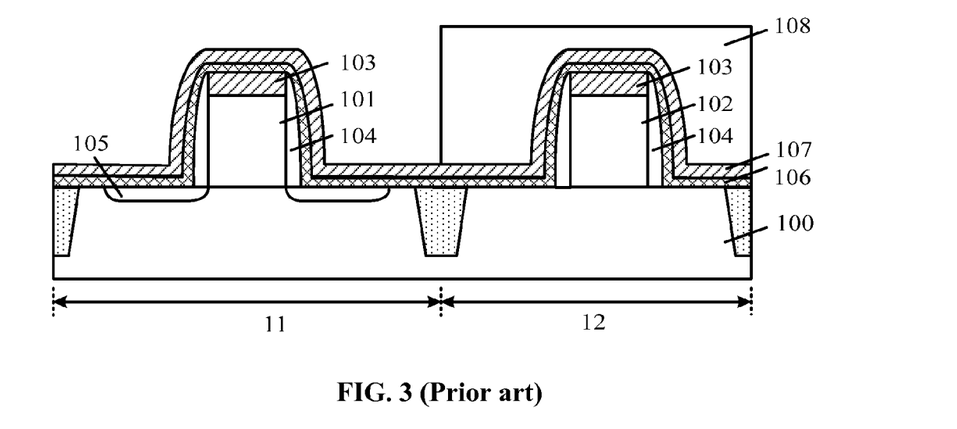

As shown in FIG. 3, after forming the first lightly doped regions 105, a second sidewall spacer material layer 106 made of silicon oxide is formed to cover the semiconductor substrate 100, the patterned mask layer 103 and the first sidewall spacers 104. Further, a third sidewall spacer material layer 107 made of silicon nitride is formed on the second sidewall spacer material layer 106. Further, a photoresist mask 108 is formed to cover the third sidewall spacer material layer 107 in the second region 12.

Figure 4:
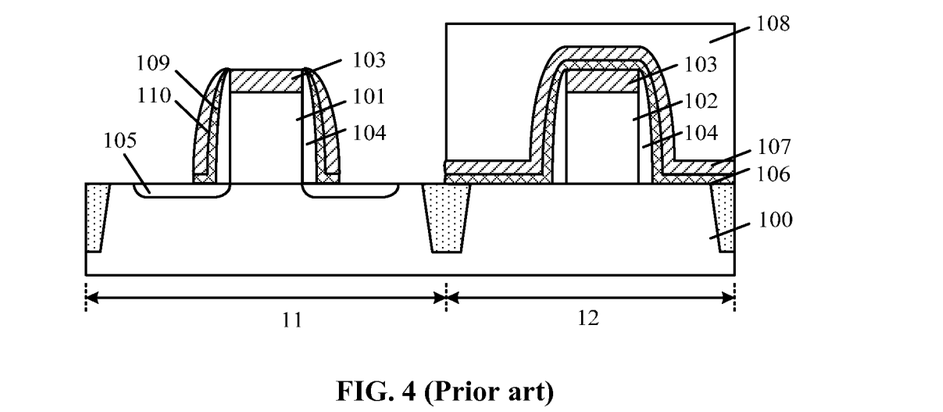

As shown in FIG. 4, after forming the photoresist mask 108, second sidewall spacers 109 are formed on the side surface of the first gate 101; and the third sidewall spacers 110 are formed on the second sidewall spacers 109 by etching the third sidewall spacer material layer 107 and the second sidewall spacer material layer 106 in the first region 11. The second sidewall spacers 109 are used as stop layers for subsequently removing the third sidewall spacers 110. The third sidewall spacer material layer 107 and the second sidewall spacer material layer 106 are kept for subsequently selectively forming a SiGe source region and a SiGe drain region in the first region 11.

Figure 5:
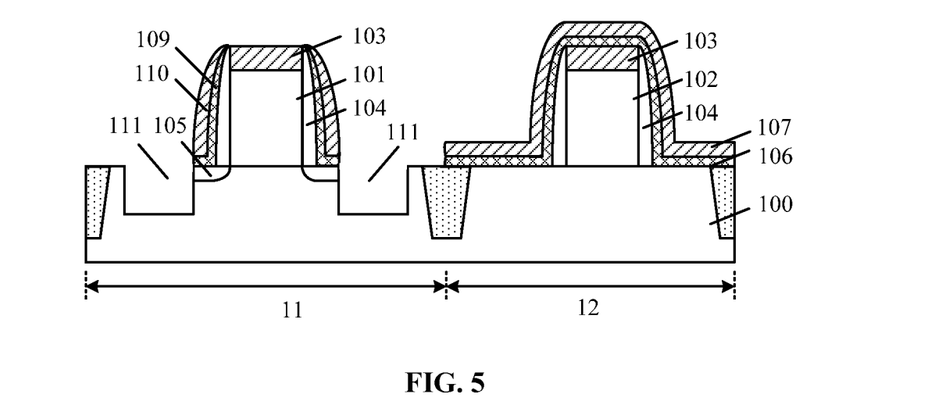

As shown FIG. 5, after forming the second sidewalls 109 and the third sidewall spacers 110, the photoresist mask 108 is removed; and the trenches 111 are formed in the semiconductor substrate 100 at both sides of the third sidewall spacers 109 in the first region 11. The trenches 111 are formed by etching the semiconductor substrate using the patterned mask layer 103, the first sidewall spacer 104, the second sidewall spacers 109 and the third sidewall spacers 110 as an etching mask. The trenches 111 are rectangular.

After forming the trenches 111, a wet cleaning process is used to clean side surfaces and bottom surfaces of the trenches 111 to remove oxide layers on the side surfaces and the bottom surfaces of the trenches 111. After the wet cleaning process, the side surfaces and the bottom surfaces of the trenches 111 would keep a relatively high cleanliness; and the relatively high cleanliness helps subsequently formed sigma shape trenches to have a desired geometry.

Figure 6:
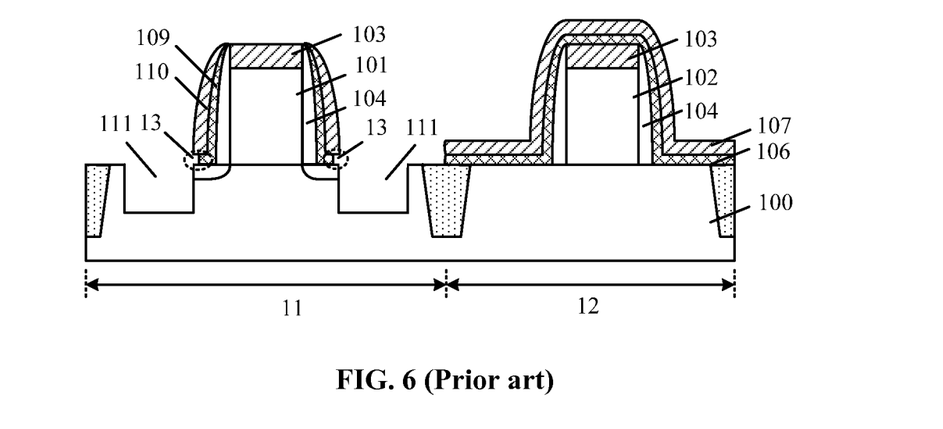

The cleaning solution of the wet cleaning process is a hydrogen fluoride (HF) solution. Because the second sidewall spacers 109 are made of silicon oxide, when the trenches 111 is being cleaned by the HF solution, as shown in FIG. 6, the second sidewall spacers 109 at the bottom of the third sidewall spacers 110 are also etched simultaneously; and lateral shrinking defects 13 are formed. Because the number of the first gate 101 formed on the semiconductor substrate 100 is a plural, after forming the second sidewall spacers 109 on the side surfaces of a plurality of first gates 101, the thickness differences of the second sidewall spacers 109 on both sides of each of the first gate 101 and/or on both sides of the first gates 101 at different regions may exist because of limitations or differences of the etching processes. After cleaning the trenches 111 with the wet cleaning process, because of the thickness differences of the second sidewall spacers 109 and the limitations of the etching processes, the shrinkages of the lateral shrinking defects 13 of the second sidewall spacers 109 on the side surfaces of a same first gate 101 may be different; shrinkages of the lateral shrinking defects 13 of the second sidewall spacers 109 on side surfaces of the different first gates 101 may also be different.

Figure 7:
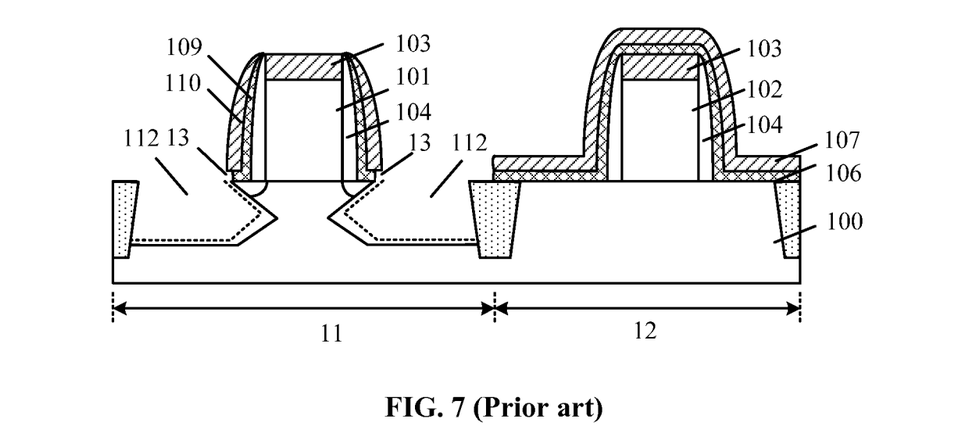

As shown in FIG. 7, after cleaning the trenches 111, sigma-shape trenches 112 are formed by etching the trenches 111. The sigma-shape trenches 112 have apex angles directing to the channel region of the PMOS transistor. The trenches 111 are etched by a TMAH solution to form the sigma-shape trenches 112. Because of the shrinking defects 13, the etching starting positions of the sigma-shape trenches 112 may change. Referring to FIG. 7, deviations between the positions of the apex angles of the sigma-shape trenches 112 and positions of apex angles of designed sigma-shape trenches (illustrated with dashed lines in FIG. 7) are formed. Such deviations may deteriorate the control of the electrical stability of the PMOS transistor. Further, because of the shrinkage differences of the shrinking defects 13, corresponding positions of the apex angles of the sigma-shape trenches 112 are different, the uniformity of the apex angles of the sigma-shape trenches 112 may be not acceptable; and the uniformity of the electrical properties of subsequently formed transistors may also not acceptable neither.

Figure 8:
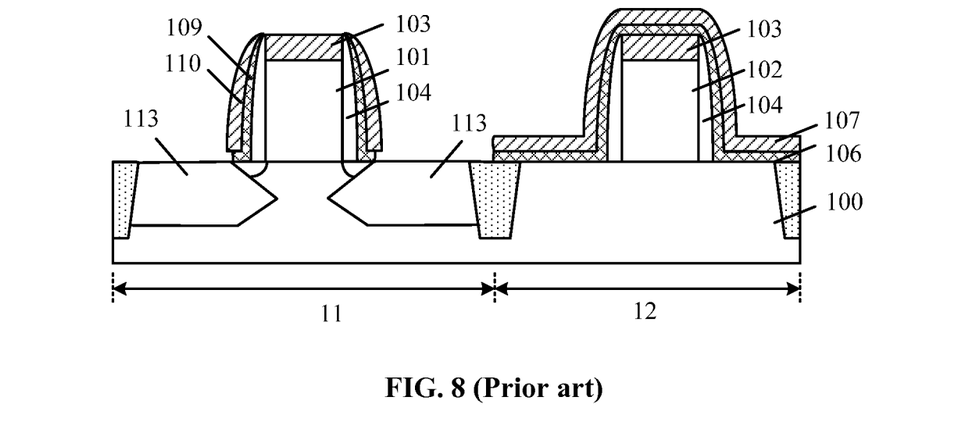

As shown in FIG. 8, after forming sigma-shape trenches 112, the sigma-shape trenches 112 are filled up with SiGe, and SiGe source/drain regions 113 are formed. The SiGe source/drain regions 113 are formed by a selective epitaxial process.

Figure 9:
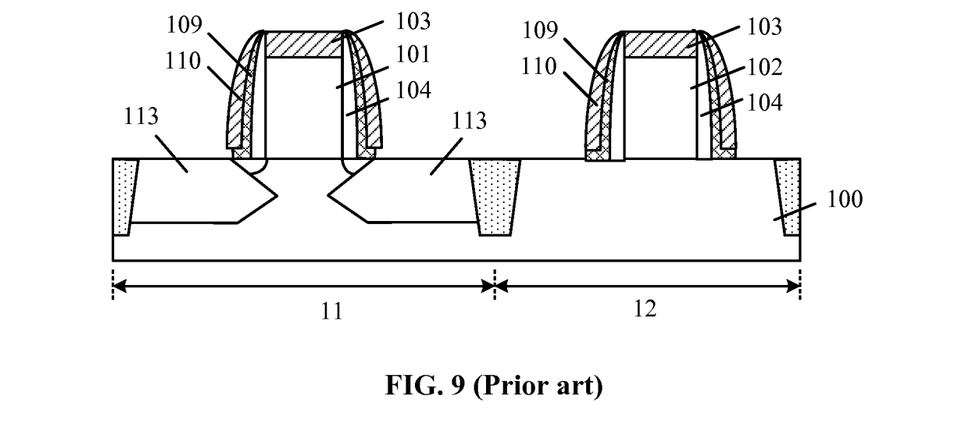

As shown in FIG. 9, after forming the SiGe source/drain regions 113, second sidewall spacers 109 are formed on the first sidewall spacers 104 on the second gate 102 in the second region 12. Further, third sidewall spacers 110 are formed on the second sidewall spacers 109. The second sidewall spacers 109 and the third sidewall spacers 110 on the second gate 102 in the second region 12 of the semiconductor substrate 100 are formed by etching the third sidewall spacer material layer 107 and the second sidewall spacer material layer 106 on the second gate 102 in the second region 12 by a mask-less etching process (an etch back process).

Referring to FIG. 9, after the mask-less etching process, a portion of the second sidewall spacer material layer 106 and a portion of the third sidewall spacer material layer 107 on the top of the patterned mask 103 are removed. Thus, when the third sidewall spacers 110 are subsequently removed, the patterned mask 103 in the second will be removed simultaneously. The mask-less etching process generates some damages to the semiconductor substrate 100.

Figure 10:
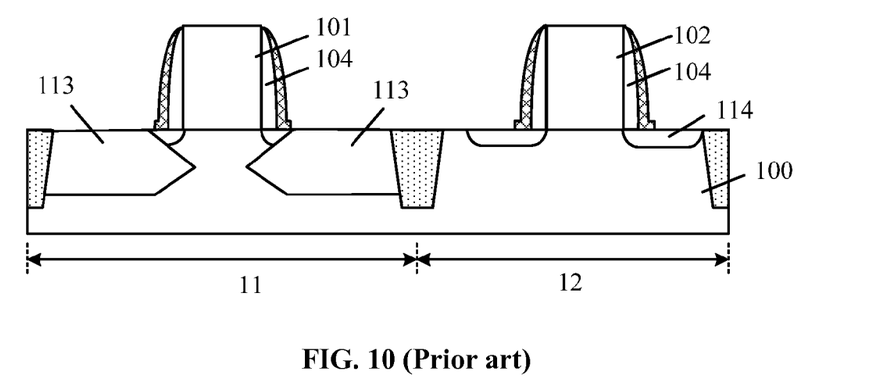

As shown in FIG. 10, after forming the second sidewall spacers 109 and the third sidewall spacers 110 in the second region 12, the third sidewall spacers 110 and the patterned mask layer 103 are removed by a wet etching process. Because the third sidewall spacers 110 are already damaged by previous processes, it may be difficult to control positions of subsequently formed heavily doped regions, the third sidewall spacers 110 need to be removed before forming the heavily doped regions. Further, the second sidewall spacers 109 are used for forming second lightly doped regions 114 in the semiconductor substrate 100 in the second region 12. Specifically, an N-type ion implantation process is performed onto the semiconductor substrate 100 at both sides of the second sidewall spacer 109 in the second region 12 using the second sidewall spacers 109, the first sidewall spacers 104 and the second gate 102 in the second region 12 as a mask; thus the second lightly doped regions 114 are formed.

Figure 11:
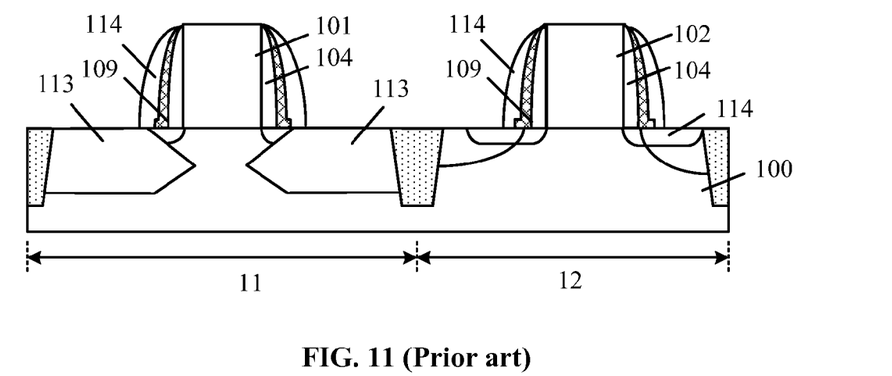

As shown in FIG. 11, after removing the third sidewall spacers 110 and the patterned mask 103, the fourth sidewall spacers 115 are formed on the second sidewall spacers 109 in the first region 11 and the second region 12. Further, third heavily doped regions (not shown) are formed in the semiconductor substrate 100 in the first region 11 at both sides of the first gate 101 by a P-type ion implantation process using the fourth sidewall spacers 115 and the first gate 101 in the first region 11 as a mask. The third heavily doped regions can also be formed by an epitaxial process with an in situ doping. The first lightly doped regions 105 and the third heavily doped region together form the source/drain regions of a PMOS transistor. Further, fourth lightly doped regions (not labeled) are formed in the semiconductor substrate 100 in the second region 12 at both sides of the second gate 102 by an N-type ion implantation process using the fourth sidewall spacers 115 and the second gate 102 in the second region 12 as a mask. The second lightly doped regions 114 and the fourth heavily doped regions together form the source/drain regions of the NMOS transistor.

Because the uniformity of the apex angles of the sigma-shape trenches 112 may be not acceptable, the uniformity of the electrical properties of subsequently formed transistors may also not acceptable neither. The disclosed device structures and methods are directed to solve the un-uniformity issues of the apex angles of the sigma-shape trenches during forming CMOS transistors with the embedded SiGe technology set forth above; and other problems.

BRIEF SUMMARY OF THE DISCLOSURE

One aspect of the present disclosure includes a method for fabricating CMOS transistors. The method includes providing a semiconductor substrate having at least one first region and at least one second region; and forming a first gate on a surface of the semiconductor substrate in the first region and a second gate on the surface of the semiconductor substrate in the second region. The method also includes forming first offset spacers made of nitrogen-contained material on side surfaces of the first gate and the second gate; and forming dummy spacers on the first offset spacers and a dummy spacer material layer covering the second gate and the semiconductor substrate in the second region. Further, the method includes forming SiGe stress layers in the semiconductor substrate at both sides of the first gate; and removing the first offset spacers, the dummy spacers and the dummy spacer material layer. Further, the method also includes forming second offset spacers on the first gate and the second gate; forming N-type lightly doped regions in the semiconductor substrate in the second region at both sides of the second gate and the second offset spacers; and forming main sidewall spacers on the second offset spacers.

Another aspect of the present disclosure includes CMOS transistors. The CMOS transistors includes a semiconductor substrate having at least one first region and at least one second region; and a first gate formed on the semiconductor substrate in the first region and a second gate formed on the semiconductor substrate in the second region. The CMOS transistors also includes P-type doped sigma-shape SiGe stress layers formed in the semiconductor substrate at both sides of the first gate in the first region; and N-type lightly doped regions and heavily doped regions formed in the semiconductor substrate at both sides of the second gate in the second region. Further, the CMOS transistors include second offset spacers formed on side surfaces of the first gate and the second gate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 24:
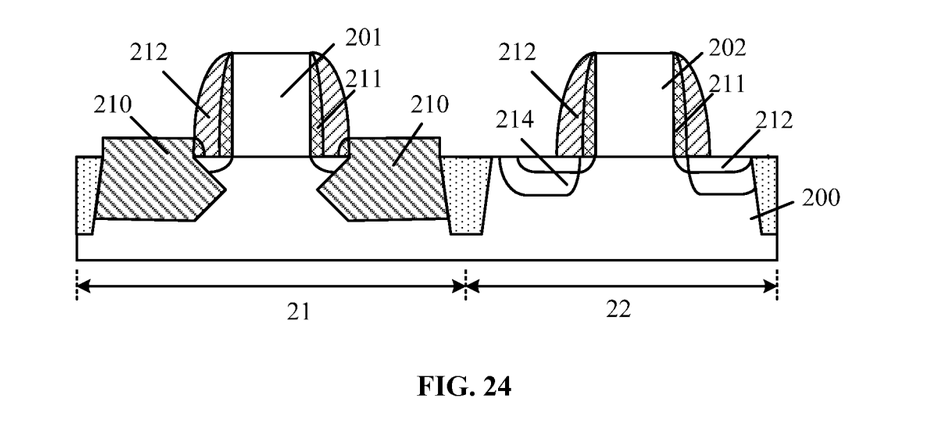
Figure 25:
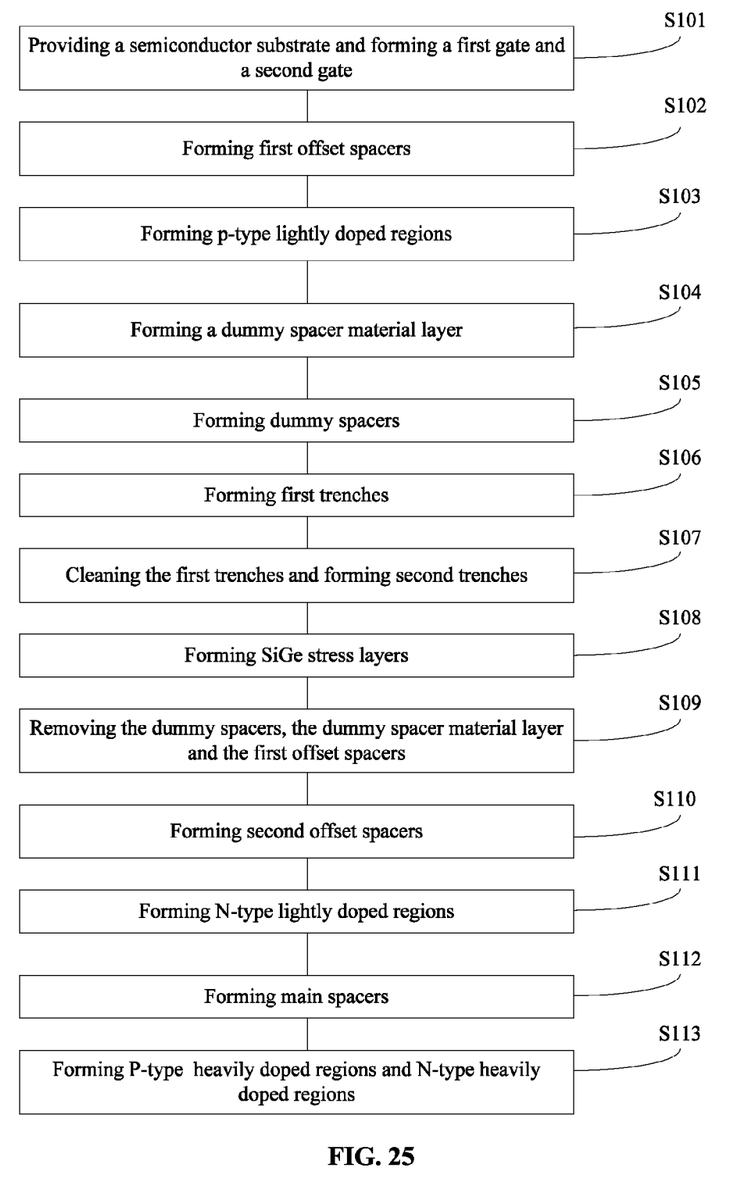
FIG. 25 illustrates an exemplary fabrication process of CMOS transistors consistent with the disclosed embodiments.

FIG. 25 illustrates an exemplary fabrication process of CMOS transistors consistent with the disclosed embodiments; and FIGS. 12~24 illustrate semiconductor structures corresponding to certain stages of the exemplary fabrication process.

Figure 12:
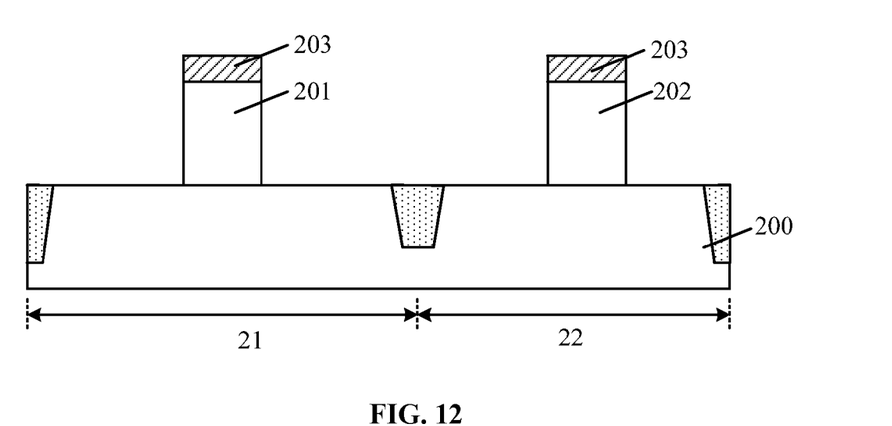
FIGS. 12~24 illustrate semiconductor structures corresponding to certain stages of an exemplary fabrication process of CMOS transistors.

As shown in FIG. 25, at the beginning of the fabrication process, a semiconductor substrate with certain structures is provided (S101). FIG. 12 illustrates a corresponding semiconductor structure.

As shown in FIG. 12, a semiconductor substrate 200 is provided. The semiconductor substrate 200 may include at least one first region 21 and at least one second region 22. A first gate 201 may be formed on the surface of the semiconductor substrate 200 in the first region 21; and a second gate 202 may be formed on the surface of the semiconductor substrate 200 in the second region 22. Further, isolation structures (not labeled) may be formed in the semiconductor substrate 200 to isolate the first region 21 and the second region 22, and/or subsequently formed devices and structures formed in the first region 21 and the second region 22.

The first region 21 of the semiconductor substrate 200 may be used to subsequently forming a PMOS transistor. An N-type well region (not shown) may be formed in the semiconductor substrate 200 in the first region 21. The second region 22 of the semiconductor substrate 200 may be used to subsequently form an NMOS transistor. A P-type well region (not shown) may be formed in the semiconductor substrate 200 in the second region 22. In certain other embodiments, the first region 21 may be used to subsequently form an NMOS transistor; and the second region 22 may be used to subsequently form a P-MOS transistor.

The first region 21 and the second region 22 may be adjacent. In certain other embodiments, semiconductor devices or structures may be formed in and/or on the semiconductor substrate 200 between the first region 21 and the second region 22.

The semiconductor substrate 200 may include any appropriate semiconductor materials, such as silicon, silicon on insulator (SOI), germanium on insulator (GOI) silicon germanium, carborundum, indium antimonide, lead telluride, indium arsenide, indium phosphide, gallium arsenidie, gallium antimonite, or ally semiconductor, etc. In one embodiment, the semiconductor substrate 200 is silicon. The semiconductor substrate 200 provides a base for subsequent structures and processes.

A process for forming the first gate 201 and the second gate 202 may include forming a gate dielectric layer (not shown) on the semiconductor substrate 200; forming a ploy silicon layer (not shown) on the gate dielectric layer; forming a hard mask layer 203 having a plurality of the openings (not labeled) on the poly silicon layer; and etching the poly silicon layer and the gate dielectric layer using the hard mask layer 203 as an etching mask. Thus, the first gate 201 may be formed on the surface of the semiconductor substrate 200 in the first region 21; and the second gate 202 may be formed on the surface of the semiconductor substrate 200 in the second region 22.

The gate dielectric layer may be made of any appropriate material, such as silicon oxide, silicon nitride, silicon oxynitride, or any appropriate high dielectric constant material, etc. In one embodiment, the gate dielectric layer is made of silicon oxide.

Various processes may be used to form the gate dielectric layer, such as a chemical vapor deposition (CVD) process, a physical vapor deposition (PVD) process, a flowable CVD (FCVD) process, or an atomic layer deposition (ALD) process, etc.

The poly silicon layer may be substituted by any other appropriate conductive material, such as Al, Cu, or Ti, etc. The poly silicon layer is configured as gate electrode layers of CMOS transistors.

Various processes may be used to form the poly silicon layer or other gate electrode layer, such as PVD process, a CVD process, an FCVD process, an electro chemical plating process, or a sputtering process, etc.

The hard mask layer 203 may be made of any appropriate material, such as silicon oxide, silicon nitride, silicon oxynitride, or silicon carbonitride, etc. In one embodiment, the hard mask layer 203 is made of silicon nitride.

Various processes may be used to form the hard mask layer 203, such as a CVD process, a PVD process, an ALD process, or an FCVD process, etc.

The gate dielectric layer and the poly silicon layer may be etched by any appropriate process, such as a dry etching process, a wet etching process, or an ion beam etching process, etc.

The isolation structures may be shallow trench isolation (STI) structures. Material filled in the STI structure may include one or more of silicon oxide, silicon nitride, or silicon oxynitride, etc. The STI structures may be used to isolate active regions in the first region 21 and the second region 22; and prevent electrical connections of different transistors. In certain other embodiments, the isolation structures may be omitted.

After forming the first gate 201 and the second gate 102, a gate oxidation process may be performed to form an oxide layer on surfaces of the semiconductor substrate 200, the first gate 201 and the second gate 202. The gate oxidation process may be used to repair damages to the surface of the semiconductor substrate 200 caused by the etching process for forming the first gate 201 and the second gate 202.

Figure 13:
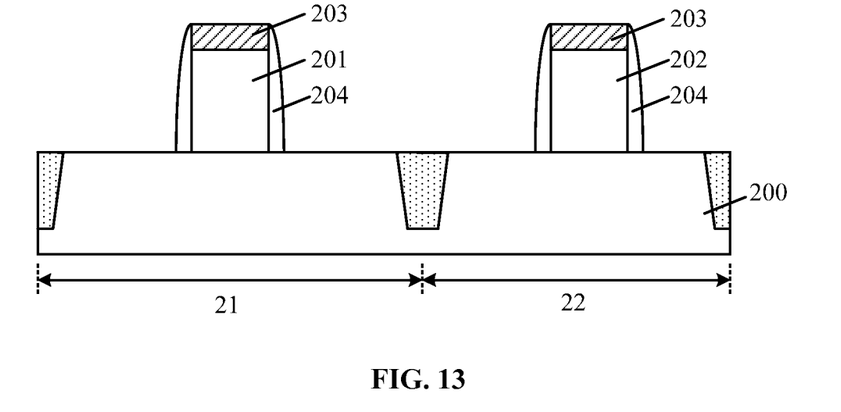

Returning to FIG. 25, after providing the semiconductor substrate 200 and forming the first gate 201 and the second gate 202, first offset spacers may be formed on the side surfaces of the first gate 201 and the second gate 202 (S102). FIG. 13 illustrates a corresponding semiconductor structure.

As shown in FIG. 13, first offset spacers 204 are formed on the side surfaces of the first gate 201 and the second gate 202. A portion of the first offset spacers 204 may also cover the side surfaces of the hard mask layer 203. The first offset spacers 204 may be used to protect the first electrode 201 during subsequently forming P-type lightly doped regions. A lightly doped region may refer to a doped region with the doping concentration smaller than a heavily doped region.

A process for forming the first offset spacers 204 may include forming a first offset spacer material layer covering surfaces of semiconductor substrate 200, the first gate 201, the second gate 202 and the mask layer 203; and etching the first offset spacer material layer to remove the first sidewall spacer material layer on the surface of the semiconductor substrate 200 and the surface of the hard mask layer 203 using a mask-less etching process (an etch back process), thus the first offset spacers 204 may be formed on the side surfaces of the first gate 201, the second gate 202 and the hard mask layer 203.

The first offset spacers 204 may be made of any appropriate nitrogen-contained material, such as silicon nitride, silicon oxynitride, or silicon carbonitride, etc. In one embodiment, the first offset spacers 204 are made of silicon nitride.

Various processes may be used to form the first offset spacer material layer, such as a CVD process, a PVD process, an ALD process, or an FCVD process, etc.

The mask-less etching process may include a dry etching process, a wet etching process, or an ion beam etching process, etc.

Figure 14:
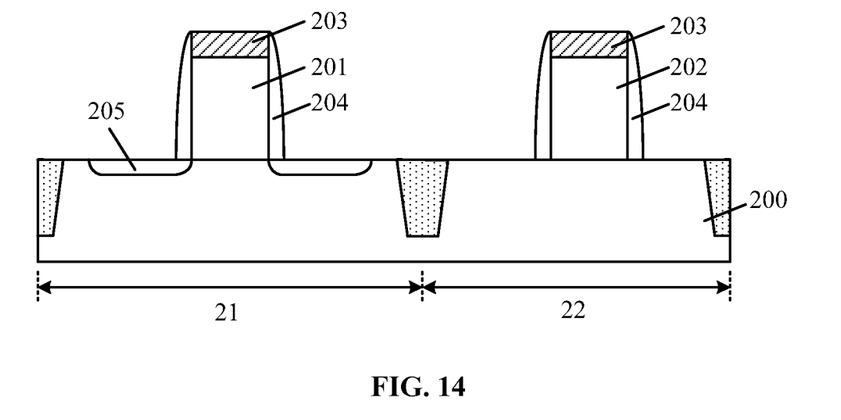

Returning to FIG. 25, after forming the first offset spacers 204, lightly doped regions may be formed in the semiconductor substrate 200 in the first region 21 (S103). FIG. 14 illustrates a corresponding semiconductor structure.

As shown in FIG. 14, lightly doped regions 205 are formed in the semiconductor substrate 200 at both sides of the first gate 201 in the first region 21. A PMOS transistor may be formed in the first region 21, thus the lightly doped regions 205 may be P-type doped.

The P-type lightly doped regions 205 may be formed by any appropriate process, such as an ion implantation process, or a diffusion process, etc. In one embodiment, the P-type lightly doped regions 205 are formed by an ion implantation process. The P-type doping ions of the ion implantation process may include one or more of boron ions, gallium ions, or indium ions, etc.

Figure 15:
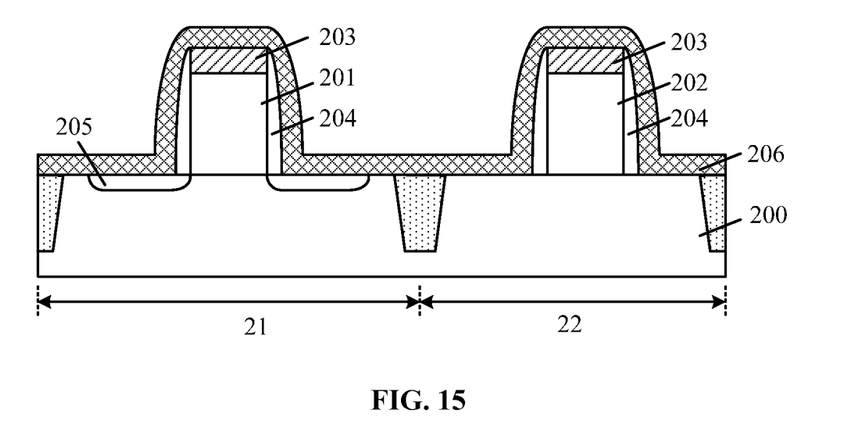

Returning to FIG. 25, after forming the P-type lightly doped regions 205, a dummy spacer material layer may be formed (S104). FIG. 15 illustrates a corresponding semiconductor structure.

As shown in FIG. 15, a dummy spacer material layer 206 is formed on the surfaces of the semiconductor substrate 200, the hard mask layer 203, and the first offset spacers 204.

The dummy spacer material layer 206 may be made of any appropriate nitrogen-contained material, such as silicon nitride, silicon oxynitride, or silicon carbonitride, etc. The dummy spacer material layer 206 may be made of a material same as the first offset spacers 204, thus the dummy spacer material layer 206 and the first offset spacers 204 may be subsequently removed by a same process. In one embodiment, the dummy spacer material layer 206 is made of silicon nitride.

Various processes may be used to form the dummy spacer material layer 206, such as a CVD process, a PVD process, an ALD process, an FCVD process, etc.

Figure 16:
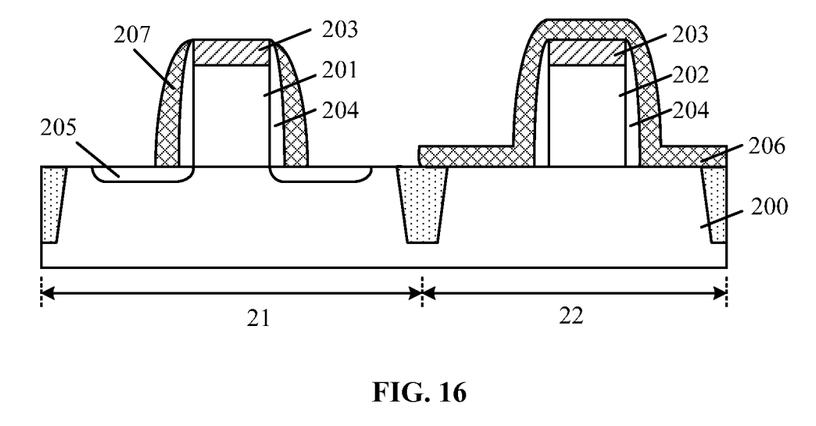

Returning to FIG. 25, after forming the dummy spacer material layer 206, dummy spacers may be formed (S105). FIG. 16 illustrates a corresponding semiconductor structure.

As shown in FIG. 16, the dummy spacers 207 are formed on the first offset spacers 204 on the first gate 201 in the first region 21. A portion of the dummy spacer material layer 206 on first offset spacers 204 and the hard mask layer 203 on the second gate 202 in the second region 22 may be kept.

The dummy spacers 207 may be formed by etching the dummy spacer material layer 206 in the first region 21 using a mask-less etching process. Portions of the dummy spacer material layer 206 on the surface of the semiconductor substrate 200 and the hard mask layer 203 in the first region 21 may be removed, thus the dummy spacers 207 may be formed on the first offset spacers 204 on the first gate 201 in the first region 21. Referring to FIG. 16, the portion of the dummy spacer material layer 206 on the first offset spacers 204 and the hard mask layer 203 on the second gate 202 in the second region 22 may be kept.

The portion of the dummy spacer material layer 206 on the first offset spacers 204 and the hard mask layer 203 on the second gate 202 in the second region 22 may be used to protect the semiconductor substrate 200 and the second gate 202 in the second region 22 during subsequent processes, so that the semiconductor substrate 200 in the second region 22 may unlikely be consumed during the subsequent etching processes, thus the silicon loss during subsequently removing the dummy offset spacers 207 and the remaining dummy spacer material layer 206 may be prevented. The remaining dummy spacer material layer 206 in the second region 22 may also be used to assist to subsequently selectively form SiGe stress layers in subsequently formed second trenches in the first region 21.

Further, the positions of the dummy spacers 207 may determine the positions of subsequently formed first trenches in the semiconductor substrate 200 in the first region 21.

Figure 17:
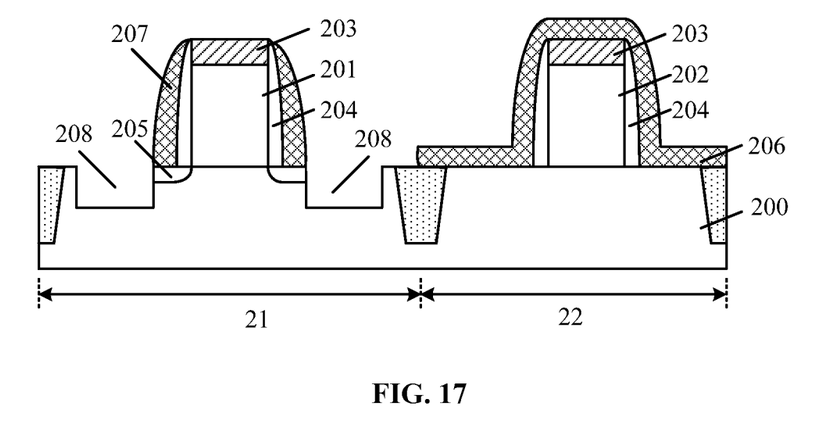

Returning to FIG. 25, after forming the dummy spacers 207, first trenches may be formed in the semiconductor substrate 200 in the first region 21 (S106). FIG. 17 illustrates a corresponding semiconductor structure.

As shown in FIG. 17, first trenches 208 are formed in the semiconductor substrate 200 at both sides of the dummy spacers 207 in the first region 21. The shape of the first trenches 208 may be rectangular. Other shapes may also be used.

The first trenches 208 may be formed by etching the semiconductor substrate 200 in the first region 21 using the first gate 201, the first offset spacers 204 and the dummy spacers 207 in the first region 21 as an etching mask. Various processes may be used to etch the semiconductor substrate 200, such as a dry etching process, a wet etching process, or an ion beam etching process, etc. In one embodiment, a dry etching process is used to etch the substrate 200 to form the first trenches 208.

Any appropriate gas may be used as an etching gas of the dry etching process, such as HBr, or $Cl_2$, etc. The etching gas may also include He or $O_2$, etc. The flow of HBr or $Cl_2$ may be in a range of approximately 50 sccm~1000 sccm. The flow of He or $O_2$ may be in a range of approximately 5 sccm~20 sccm. The pressure of the etching chamber of the dry etching process may be in a range of approximately 5 mTorr~50 mTorr. The source power of the dry etching process may be in a range of approximately 500 W~3000 W; and the bias power may be in a range of approximately 100 W~2000 W.

Figure 18:
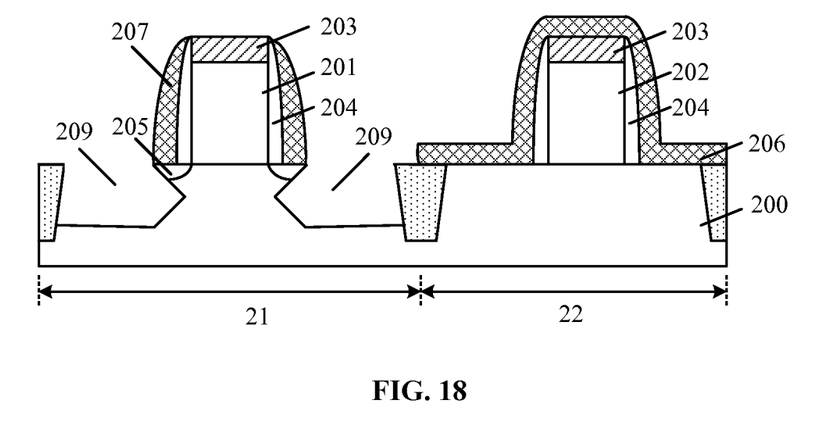

Returning to FIG. 25, after forming the first trenches 208, the first trenches 208 may be cleaned; and second trenches may be formed (S107). FIG. 18 illustrates a corresponding semiconductor structure.

As shown in FIG. 18, second trenches 209 are formed in the semiconductor substrate 200 at both sides of the dummy spacers 207 in the first region 21. The second trenches 209 may have a sigma-shape. Thus, the second trenches 209 may be referred as sigma-shape trenches 209. The second trenches 209 may be used to subsequently form sigma-shape SiGe embedded structures.

After forming the first trenches 208 by the dry etching process, polymer residues (not shown) may be formed on side surfaces of the first trenches 208. Further, thermal oxide layers (not shown) may also be formed on the side surfaces of the first trenches 208. The polymer residues and the thermal oxide layers may affect the apex angle positions and geometries of the subsequently formed sigma-shape trenches 209. Thus, the first trenches 208 may need to be cleaned before forming the sigma-shape trenches 209. Specifically, the polymer residues and the thermal oxide layers may be removed to keep the cleanliness of the side surfaces and the bottom surfaces of the first trenches 208.

The first trenches 208 may be cleaned by any appropriate process. In one embodiment, the first trenches 208 are cleaned by a wet chemical cleaning process. A cleaning solution of the wet cleaning process may be a diluted hydrogen fluoride (HF) solution. The water to hydrogen fluoride ratio of the diluted hydrogen fluoride solution may be in a range of approximately 200:1~1000:1.

During the wet chemical cleaning process, because the dummy spacers 207 may be made of a single layer nitrogen-contained silicide, the HF solution may barely etch bottoms of the dummy spacers 207. Therefore, the shrinking defect may be avoided; or the shrinkage may be substantially small. When the wet etching process is subsequently used to etch the first trenches 208, the etching starting points may unlikely change, thus the apex angle uniformities of the sigma trenches 209 formed in the semiconductor substrate 200 at both sides of the first gate 201 or both sides of the first gates 201 in different regions may be acceptable. The apex angle uniformities may refer to the uniformities of the depths of the apex angles of the sigma-shape trenches 209 directing to the channel region in the semiconductor substrate 200 and the uniformities of vertical distances between the apex angles and an extension line of the side surface of the first gate 201.

Further, referring to FIG. 18, after cleaning the first trenches 208, the second trenches 209 may be formed by etching the first trenches 208. The second trenches 209 may have a sigma-shape. That is, the second trenches 209 may have apex angles directing to the channel region of the transistor.

The second trenches 209 may be formed by any appropriate process, such as a dry etching process, or a wet etching process, etc. In one embodiment, the second trenches 209 are formed by a wet etching process. An etching solution of the wet etching process may include a tetramethylazanium hydroxide (TMAH) solution, a NH$_3$.H$_2$O solution, or a KOH solution, etc. The etching temperature may be in a range of approximately 20° C.~100° C. The etching time may be in a range of approximately 30 s~400 s.

In one embodiment, the etching solution is a TMAH solution. The TMAH solution may have different etching rates along different crystal orientations. For example, the etching rate along the (100) crystal face may be the fastest; and the etching rate along the (111) crystal face may be the lowest, thus the sigma shape may be formed after the wet etching process with a TMAH solution.

Figure 19:
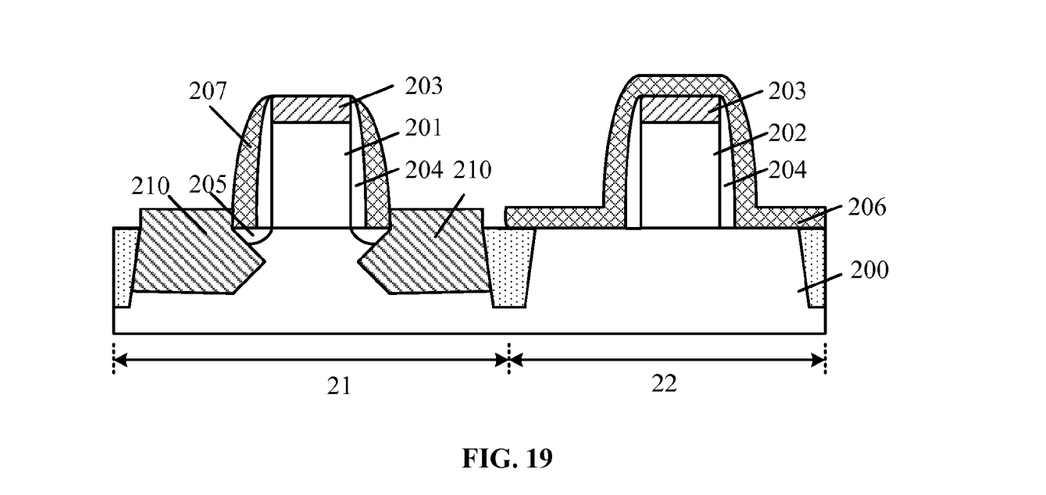

Returning to FIG. 25, after forming the second trenches 209, SiGe stress layers may be formed in the second trenches 209 (S108). FIG. 19 illustrates a corresponding semiconductor structure.

As shown in FIG. 19, SiGe stress layers 210 are formed in the trenches 209. The shape of the SiGe stress layers 210 may be also a sigma shape. Various processes may be used to form the SiGe stress layers 210, such as a CVD process, a PVD process, an ALD process, an FCVD process, or a selective epitaxial process, etc. In one embodiment, the SiGe stress layers 210 are formed by a selective epitaxy process.

The temperature of the selective epitaxy process may be in a range of approximately 600° C.~1100° C.; and the pressure may be in a range of approximately 1 Torr~500 Torr. The silicon source of the selective epitaxy process may be SiH$_4$ or dichlorosilane, etc.; and the germanium source may be GeH$_4$, etc. HCl and hydrogen may also be included in the source gases. Hydrogen may be used as a carrier gas. HCl may be used as a selective gas to increase the selectivity of the selective epitaxy process. Other appropriate gas may also be used as the carrier gas, such as Ar, etc. Other appropriate gas may also be used as the selective gas, such Cl$_2$, etc. The flow of the silicon source gas may be in a range of approximately 1 sccm~1000 sccm. The flow of the germanium gas may be in a range of approximately 1 sccm~1000 sccm. The flow of HCl may be in a range of approximately 1 sccm~1000 sccm. The flow of hydrogen may be in a range of approximately 0.1 slm~50 slm.

In one embodiment, during a process for forming the SiGe stress layers 210, an in situ P-type doping may be performed. Specifically, a doping source gas, such as B$_2$H$_6$, or BF$_3$, etc., may be introduced into the reaction chamber of the epitaxy process when the SiGe stress layers 210 are being formed. The P-type ions of the in situ P-type doping may include one or more of boron ions, gallium ions, and indium ions, etc.

The P-type doped SiGe layers 210 and the P-type doped lightly doped regions 205 may form source/drain regions of the PMOS transistor. In certain other embodiments, the SiGe layers 210 may be doped by an ion implantation process.

Referring to FIG. 19, the surfaces of the SiGe stress layers 210 may be higher than the surface of the semiconductor substrate 200, thus an enough silicon source may be provided for subsequently forming metal silicide on the surfaces of the source/drain regions.

Figure 20:
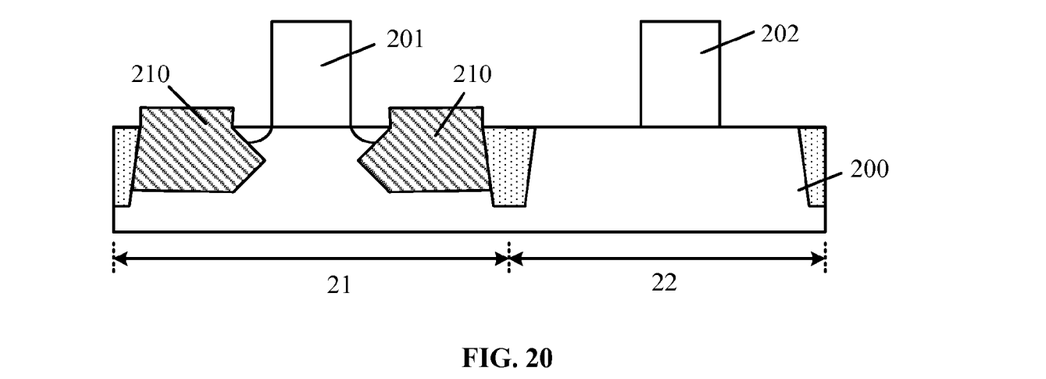

Returning to FIG. 25, after forming the SiGe stress layers 210, the first offset spacers 204 and the dummy spacers 207 on the first gate 201 in the first region 21, the dummy spacer material layer 206 and the first offset spacers 204 on the second gate 202 in the second region 22 and the hard mask layer 203 may be removed (S109). FIG. 20 illustrates a corresponding semiconductor structure.

As shown in FIG. 20, the first offset spacers 204 on the side surfaces of the first gate 201 in the first region 21 and the dummy spacers 207 on the first offset spacers 204 are removed. The dummy spacer material layer 206 in the second region 22 and the first offset spacers 204 on the side surfaces of the second gate 202 in the second region 22 are also removed. Further, the hard mask layer 203 is also removed. That is, only the first gate 201 and the second gate 202 are kept.

Various processes may be used to remove the first offset spacers 204, the dummy spacers 207, the dummy spacer material layer 206 and the hard mask layer 203, such as a dry etching process, a wet etching process, or an ion beam etching process, etc. In one embodiment, the first offset spacers 204, the dummy spacers 207, the dummy spacer material layer 206 and the hard mask layer 203 are removed by a wet etching process. Because the first offset spacers 204, the dummy spacers 207, the dummy spacer material layer 206 and the hard mask layer 203 may be made of a same material, only one wet etching process may be needed. Thus, the fabrication processes may be simplified; and the process for removing the first offset spacers 204, the dummy spacers 207, the dummy spacer material layer 206 and the hard mask layer 203 may be referred as a whole SiN removal process.

Further, in one embodiment, the dummy spacer material layer 206 may be a single layer structure made of a nitrogen-contained material, it may not need an extra plasma etching process to etch the dummy spacer material layer 206 to expose the surface of the hard mask layer 203 in the second region 22, thus the silicon consumption of the surface of the semiconductor substrate 200 may be reduced.

A solution of the wet etching process for removing the first offset spacers 204, the dummy spacers 207, the dummy spacer material layer 206 and the hard mask layer 203 may include any appropriate chemicals. In one embodiment, the solution is a thick phosphoric acid solution.

Figure 21:
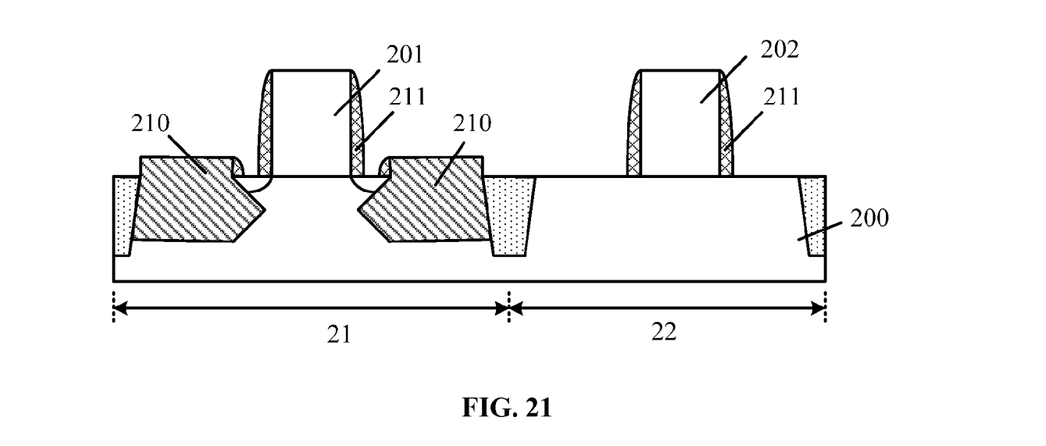

Returning to FIG. 25, after removing the first offset spacers 204, the second dummy spacers 207, the dummy spacer material layer 206 and the hard mask layer 203, second offset spacers may be formed (S110). FIG. 21 illustrates a corresponding semiconductor structure.

As shown in FIG. 21, second offset spacers 211 may be formed on the side surfaces of the first gate 201 and the second gate 202. The second offset spacers 211 may be used to protect the second gate 202 during subsequent ion implantation processes. Further, the second offset spacers 211 may be used to adjust the position of the subsequently formed N-type lightly doped regions in the semiconductor substrate 200 in the second region 22. That is, the N-type lightly doped regions may be formed in the semiconductor substrate 200 in the second region 22 at both sides of the second offset spacers 211.

The second offset spacers 211 may be made of any appropriate material, such as $SiO_2$, SiN, SiON, or SiCN, etc. The thickness of the second offset spacers 211 may be same as the thickness of the first offset spacers 204. Referring to FIG. 21, a portion of the second offset spacers 211 may be formed on the side surfaces of portions of the SiGe stress layer 210 higher than the surface of the semiconductor substrate 200. Comparing with the first offset spacers 204 and the dummy spacers 207 which may be damaged by the ion plantation processes and the etching processes, the second offset spacers 211 and subsequently formed main spacers may not be damaged, thus when a metal silicide layer is subsequently formed on the surface of the SiGe stress layers 210, penetration defects directing to the first electrode 201 generated by the metal silicide may be prevented.

A process for forming the second offset spacers 211 may include forming a second offset spacer material layer on the surfaces of the semiconductor substrate 200, the SiGe stress layers 210, the first gate 201 and the second gate 202; and followed by a mask-less etching process. Thus, a portion of the second offset spacer material layer on the surface of the semiconductor substrate 200, the top surfaces of the SiGe stress layers 210, the top surface of the first gate 201 and the top surface of the second gate 202 may be removed; and the second offset spacers 211 may be formed on the side surfaces of the first gate 201 and the second gate 202.

The second offset spacer material layer may be formed by any appropriate process, such as a CVD process, a PVD process, an ALD process, or an FCVD process, etc. The mask-less etching process may include a dry etching process, a wet etching process, or an ion beam etching process, etc.

Figure 22:
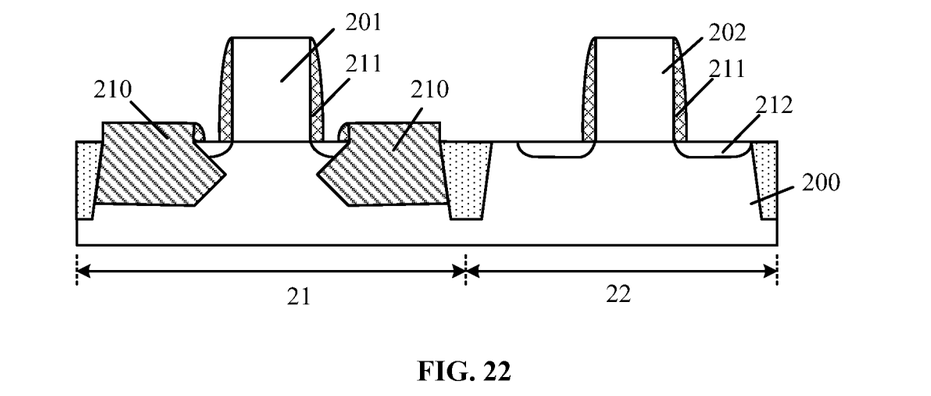

Returning to FIG. 25, after forming the second offset spacers 211, N-type lightly doped regions may be formed in the semiconductor substrate 200 in the second region 22 (S111). FIG. 22 illustrates a corresponding semiconductor structure.

As shown in FIG. 22, N-type lightly doped regions 212 are formed in the semiconductor substrate 200 in the second region 22 at both sides of the second gate 202 and the second offset spacers 211. Various processes may be used to form the N-type lightly doped regions 212, such as an ion implantation process, or a thermal diffusion process etc. In one embodiment, the N-type lightly doped regions 212 are formed by an ion implantation process. The N-type ions may include phosphoric ions, arsenic ions or antimony ions, etc. When the ion implantation process is performed, the surface of the first gate 201 and the surface of the second gate 202 may be protected by any appropriate coating, such as a photoresist layer, etc.

Figure 23:
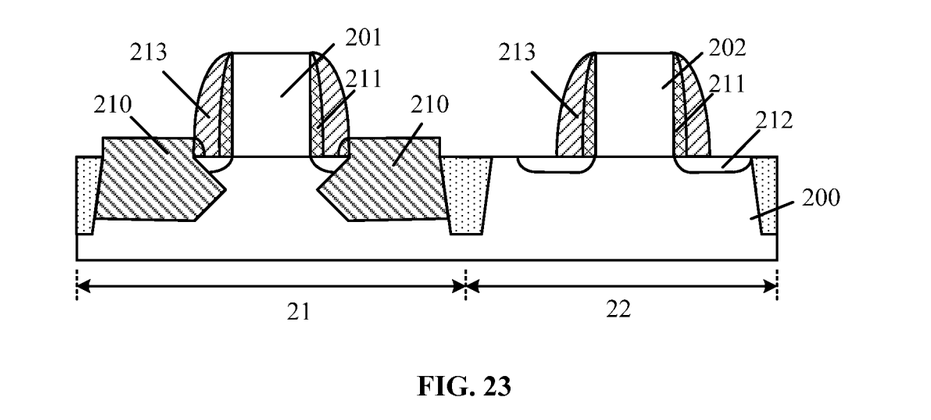

Returning to FIG. 25, after forming the N-type lightly doped regions 212, main spacers may be formed on the second offset spacers 211 (S112). FIG. 23 illustrates a corresponding semiconductor structure.

As shown in FIG. 23, main spacers 213 are formed on the second offset spacers 211. The main spacers 213 may be made of any appropriate material, such as $SiO_2$, SiN, SiON or SiCN, etc.

A process for forming the main spacers 213 may include forming a main spacer material layer on surfaces of the semiconductor substrate 200, the first gate 201, the second gate 202 and the second offset spacers 211; and followed by a mask-less etching process. Thus, a portion of the main spacer material layer on the surface of the semiconductor substrate 200, the top surface of the first gate 201 and the top surface of the second gate 202 may be removed; and the main spacers 213 may be formed on the side surfaces of the second offset spacers 211. Referring to FIG. 23, the main spacers 213 may have a tapered shape.

The main spacer material layer may be formed by any appropriate process, such as a CVD process, a PVD process, an ALD process, or an FCVD process, etc. The mask-less etching process may include a dry etching process, a wet etching process, or an ion beam etching process, etc.

Returning to FIG. 25, after forming the main spacers 213, P-type heavily doped regions may be formed in the SiGe stress layers 210 at both sides of the main spacers 213 and the first gate 201; and N-type heavily doped regions may be formed in the semiconductor substrate 200 in the second region 22 at both sides of the second gate 202 and the main spacers 213 (S113). FIG. 24 illustrates a corresponding semiconductor structure.

As shown in FIG. 24, P-type heavily doped regions (not labeled) are formed in the SiGe stress layers 210 at both sides of the first gate 201 and the main spacers 213. N-type heavily doped regions 214 are formed in the semiconductor substrate 200 in the second region 22 at both sides of the second gate 202 and the main spacers 213.

In one embodiment, the P-type heavily doped region regions may the SiGe stress layers 210 in situ doped with P-type ions. The SiGe stress layers 210 may be in situ doped when the SiGe stress layers 210 are being formed; and the P-type doped SiGe stress layers 210 may be used as the P-type heavily doped regions.

In certain other embodiments, the P-type heavily doped regions may be formed by performing a P-type ion implantation process onto the SiGe stress layers 210.

The N-type heavily doped regions 214 may be formed by an ion implantation process, or a thermal diffusion process, etc. In one embodiment, the N-type heavily doped regions 214 are formed by an ion implantation process. When the ion implantation process is used to form the N-type heavily doped regions 214, the semiconductor substrate 200 and the first gate 201 in the first region 21 may be protected by any appropriate coatings, such as a photoresist layer, etc.

After forming the P-type heavily doped regions and the N-type heavily doped regions 214, metal silicide layers (not shown) may be formed on the surfaces of the SiGe stress layers 210, the first gate 201 and the second gate 202.

A process for forming the metal silicide layers may include forming a metal layer on the surfaces of the semiconductor substrate 200, the SiGe stress layers 210, the first gate 201, the second gate 202, and the main spacers 214; annealing the metal layer to react with silicon of the semiconductor substrate 200, the SiGe stress layers 210, the first gate 201, and the second gate 202; and removing the un-reacted metal layer. Thus, a first metal silicide layer may be formed on the surface of the P-type heavily doped region; a second metal silicide layer may be formed on the surface of the N-type heavily dope region 214; and a third metal silicide layer may be formed on the top surfaces of the first gate 201 and the second gate 202.

Various processes may be used to form the metal layer, such as a PVD process, a sputtering process, or an electro chemical plating process, etc.

Thus, a semiconductor device may be formed by above disclosed methods and processes; and a corresponding semiconductor device is illustrated in FIG. 24. As shown in FIG. 24, the semiconductor device includes a semiconductor substrate 200 having a first region 21 and a second region 22. The semiconductor device also includes a first gate 201 formed on the semiconductor substrate 200 in the first region 21; and a second gate 202 formed on the semiconductor substrate 200 in the second region 22. Further, the semiconductor device include second offset spacers 211 formed on side surfaces of the first gate 201 and the second gate 202 and main spacers 213 formed on side surfaces of the second offset spacers 211. Further, the semiconductor devices also includes sigma-shape SiGe stress layers 210 formed in the semiconductor substrate 200 in the first region 21 at both sides of first gate 201 with the surface higher than the surface of the semiconductor substrate 200. Further, the semiconductor device also include P-type lightly doped regions 205 in the semiconductor substrate 200 in the first region 21 at both sides of the first gate 201 and N-type lightly doped regions 212 and the N-type heavily doped regions 214 in the semiconductor substrate 200 in the second region at both sides of the second gate 202.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating CMOS transistors, comprising:
   providing a semiconductor substrate having at least one first region and at least one second region;
   forming a first gate on a top surface of the semiconductor substrate in the first region and a second gate on the top surface of the semiconductor substrate in the second region;
   forming first offset spacers made of a first nitrogen-contained material on side surfaces of the first gate and the second gate;
   forming dummy spacers made of a second nitrogen-contained material on surfaces of the first offset spacers and the semiconductor substrate in the first region and a dummy spacer material layer made of the second nitrogen-contained material to cover the second gate and the top surface of the semiconductor substrate in the second region;
   forming sigma-shape SiGe stress layers in the semiconductor substrate at both sides of the first gate in the first region;
   removing the first offset spacers, the dummy spacers and the dummy spacer material layer;
   forming second offset spacers on the first gate and the second gate;
   forming N-type lightly doped drain regions in the semiconductor substrate in the second region at both sides of the second gate and the second offset spacers; and
   forming main sidewall spacers on the second offset spacers.

2. The method according claim 1, wherein forming the dummy spacers made of nitrogen-contained material on side surfaces of the first gate and the dummy spacer material layer covering the second gate further includes:
   forming the dummy spacer material layer made of the second nitrogen-contained material on the top surface of the semiconductor substrate and surfaces of the first gate and the second gate; and
   removing a portion of the dummy spacer material layer on the semiconductor substrate in the first region and on a top surface of the first gate and keeping a portion of the dummy spacer material layer in the second region.

3. The method according claim 1, before forming sigma-shape SiGe stress layers, further including:
   forming first trenches in the semiconductor substrate in the first region at both sides of the sidewall spacers;
   cleaning the first trenches; and
   etching the first trenches to form sigma-shape trenches.

4. The method according to claim 1, wherein:
   top surfaces of the SiGe stress layers are higher than the top surface of the semiconductor substrate; and
   a portion of the second offset spacers is formed on side surfaces of portions of the SiGe layers higher than the top surface of the semiconductor substrate.

5. The method according claim 1, before forming the dummy spacers, further including:
   forming lightly doped regions in the semiconductor substrate in the first region at both sides of the first gate, while no lightly doped regions are formed in the semiconductor substrate in the second region before forming the dummy spacer material layer.

6. The method according to claim 1, after forming the main sidewall spacers, further including:
   forming N-type doped heavily doped regions in the semiconductor substrate in the second region at both sides of the main sidewall spacers.

7. The method according to claim 1, wherein:
   the dummy spacers are formed by a chemical vapor deposition process, or an atomic layer deposition process.

8. The method according to claim 3, wherein:
   the first trenches are formed by a dry etching process; and
   the sigma-shape trenches are formed by a wet etching process.

9. The method according to claim 1, wherein:
   the dummy spacers and the dummy spacer material layer are removed by hot phosphoric acid.

10. The method according to claim 1, wherein forming the first gate and the second gate further includes:
    forming a gate dielectric layer on the top surface of the semiconductor substrate;
    forming a poly silicon layer on the gate dielectric layer;
    forming a hard mask layer on the poly silicon layer, the hard mask layer having openings to expose the poly silicon layer; and
    etching the poly silicon layer and the gate dielectric layer using the hard mask layer as an etching mask.

11. The method according to claim 10, wherein:
    the dummy spacers and the hard mask layer are made of a same material.

12. The method according to claim 11, wherein:
    the dummy spacers, the dummy spacer material layer and the hard mask layer are made of SiN, SiON, or SiCN.

13. The method according to claim 3, wherein:
    the first trenches are cleaned by a hydrogen fluoride solution.

14. The method according to claim 13, wherein:
a water to hydrogen fluoride ratio of the hydrogen fluoride solution is in a range of approximately 200:1.about.1000:1.

15. The method according to claim 6, after forming the N-type heavily doped region, further including:
forming metal silicide layers on surfaces of the SiGe stress layers and the N-type heavily doped regions.

16. The method according to claim 1, wherein:
each of the first nitrogen-contained material for the first offset spacers, and the second nitrogen-contained material for the dummy spacers and the dummy spacer material layer is made of SiN, SiON, or SiCN,
the first nitrogen-contained material and the second nitrogen-contained material are the same, or
the first offset spacers, the dummy spacers, and the dummy spacer material layer are removed in a same process.

17. The method according to claim 1, wherein:
each of the second offset spacers has a same thickness of each of the first offset spacers and is made of SiN, SiON, or SiCN.

18. The method according to claim 1, wherein:
the dummy spacers in the first region is made by a maskless etching process including an etching back process.

19. The method according to claim 1, further including:
immediately after forming the sigma-shape SiGe stress layers, removing the first offset spacers, the dummy spacers and the dummy spacer material layer.

* * * * *